July 23, 1974 SAKARI TAKAHASHI 3,825,455

METHOD OF PRODUCING INSULATED-GATE FIELD-EFFECT SEMICONDUCTOR DEVICE HAVING A CHANNEL STOPPER REGION

Filed March 17, 1972 2 Sheets-Sheet 1

United States Patent Office 3,825,455 Patented July 23, 1974

3,825,455

METHOD OF PRODUCING INSULATED-GATE FIELD-EFFECT SEMICONDUCTOR DEVICE HAVING A CHANNEL STOPPER REGION

Sakari Takahashi, Tokyo, Japan, assignor to Nippon Electric Company, Limited, Tokyo, Japan Filed Mar. 17, 1972, Ser. No. 235,503
Claims priority, application Japan, Mar. 19, 1971, 46/15,179
Int. Cl. H01l 7/50
U.S. Cl. 156—11 6 Claims

ABSTRACT OF THE DISCLOSURE

A method of fabricating an insulated-gate field effect transistor including a channel stopper region is disclosed wherein an insulating film formed on the substrate serves as a mask during the formation of the channel stopper region.

This invention relates generally to the manufacturing of insulated-gate field-effect semiconductor devices and more particularly to a method of manufacturing integrated circuit comprising field effect semiconductor devices.

The conventional insulated-gate field-effect semiconductor integrated circuit contains a plurality of insulated-gate field effect transistors in a semiconductor substrate, each transistor having source and drain regions of an opposite conductivity type to that of the semiconductor substrate. It is known to provide a region, commonly referred to as a channel stopper region, having the same conductivity type as the semiconductor substrate and a higher impurity concentration than the substrate, between transistors at the substrate surface in order to secure electrical insulation between the transistors. A channel stopper region is also often employed in an insulated-gate field-effect transistor as a single unit. In the latter case, the channel stopper region is formed surrounding the active region of the transistor and is commonly called "a guard ring." It is to be understood that the term "channel stopper" or "channel region" as hereinafter used in the present application includes a guard ring for a single transistor element.

In the known methods for fabricating insulated-gate field-effect semiconductor devices provided with a channel stopper, an additional photoengraving process is required for the formation of the channel stopper. This additional fabrication step, however considerably reduces the manufacturing yield rate of these devices.

The principal object of this invention is to provide a method of manufacturing an insulated-gate field-effect semiconductor device containing a channel stopper without reducing the manufacturing yield rate of these devices.

A feature of the semiconductor device manufacturing method according to the present invention is the formation of the channel stopper without increasing the number of the necessary photoengraving processes. Stated specifically, the manufacturing method comprises the steps of depositing a first insulating film of a material other than silicon dioxide on the surface of a semiconductor substrate made of silicon and forming a channel stopper region using this first insulating film as a mask. A second insulating layer (preferably, of silicon dioxide) is formed on the channel stopper region, and those parts of the first insulating film which will become windows for the formation of source and drain regions are removed. The source and drain regions are formed by impurity diffusion with the second insulating film and the remaining part of the first insulating film used as a mask, and all of the remaining first insulating film is etched without resorting to the photoresist technique.

By use of the manufacturing method according to this invention, the diffusion process for forming the channel stopper region and the succeeding diffusion process for forming the source and drain regions are performed by using the first insulating film of a material other than silicon dioxide as a mask. This is followed by the removal of the first insulating film prior to the formation of a gate insulating film. In the etching process to entirely remove the first insulating film, a photoresist is not needed by using an etching solution having substantially no or little etching effect against the second insulating film of, for example, silicon dioxide. Accordingly, the photoengraving process, which has been heretofore required immediately preceding the formation of the gate insulating film in the conventional manufacturing method using a silicon dioxide film as a mask can be eliminated in the fabricating process. For this reason, the number of times of the photoengraving processes which has the greatest effect on reducing the yield rate in the manufacture of semiconductor devices is the same in the method of the invention as that in the fabrication of an ordinary field-effect semiconductor device having no channel stopper. Thus, a decrease in manufacturing yields due to the formation of the channel stopper can be avoided by the method of the invention.

Now, the present invention will be described in greater detail referring to the accompanying drawings, wherein.

Figure 1:
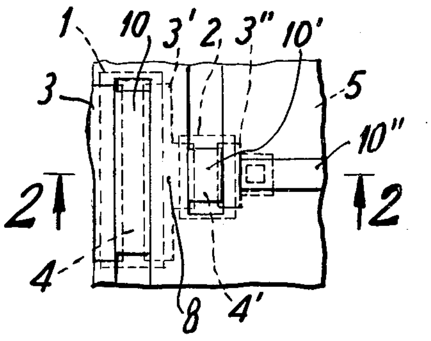
FIG. 1 is a schematic plan view of a part of a semiconductor integrated circuit employing insulated-gate field-effect transistors and having a channel stopper region constructed in accordance with an embodiment of this invention.
Figure 2:
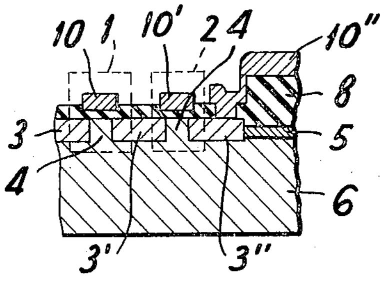
FIG. 2 is a schematic cross sectional view along line 2—2 in FIG. 1 and viewed in the direction of the arrows.

FIG. 3 through 8 are schematic cross sectional views illustrating various stages in the manufacture of the device shown in FIGS. 1 and 2 in accordance; and FIGS. 9 through 15 are schematic cross sectional views illustrating various stages in the manufacture of an insulated-gate field-effect semiconductor device according to another embodiment of this invention.

Referring to FIGS. 1 and 2, which show two series-connected insulated-gate field-effect transistors 1 and 2, the surface region of a substrate 6 except for the source, drain and channel regions 3, 3′ and 4 of the transistor 1 and the source, drain and channel regions 3′ (common to the drain of the transistor 1), 3″ and 4′ is a channel stopper region 5. In the following portion of the specification, a decription of the method of fabricating the semiconductor device of FIGS. 1 and 2 is provided according to an embodiment of this invention, with reference to FIGS. 3 through 8.

Figure 3:
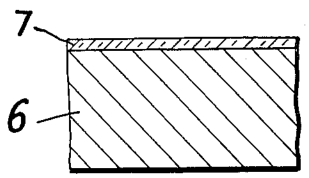

As therein shown, an alumina film 7 is deposited by a known vapor phase deposition technique on the surface of a P-type silicon single crystal substrate 6 having a specific resistivity of 4 Ω-cm., as shown in FIG. 3. The alumina film 7 may be formed by evaporating an aluminium film onto the surface of the silicon substrate 6 and then subjecting the aluminium film to anodic oxidation. A suitable thickness of the alumina film 7 is between 2,000 A. and 10,000 A. and may conveniently be about 5,000 A. The alumina film can be easily photoetched by use of a mixed solution of fluoric acid and ammonium fluoride. The entire alumina film 7 except at those regions (future active regions) in which circuit elements such as transistors and diffused resistors are to be formed, i.e., on the region to become the channel stopper, is selectively removed by a photoetching technique using the above mentioned etchant solution, as shown in FIG. 4.

Figure 6:
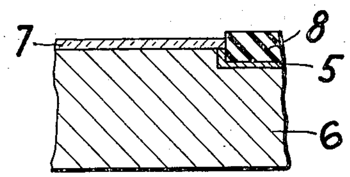
Figure 4:
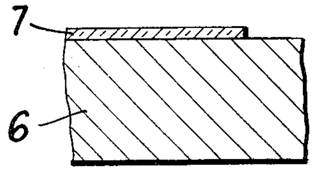
Figure 5:
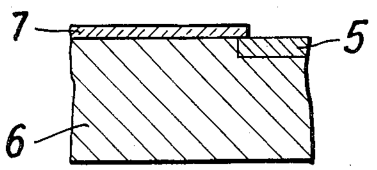

The vapor phase diffusion of boron is then carried out by placing the substrate 6 shown in FIG. 4 in a mixed gas atmosphere of boron trichloride ($BCL_3$) and hydrogen ($H_2$) for 10 minutes at a temperature of 770° C. The alumina film 7 plays the role of a mask for the diffusion of boron whereby the channel stopper region 5 of the same conductivity type as and a higher concentration than the substrate 6, that is of $p^+$ type, is formed on the exposed surface of the substrate, as shown in FIG. 5. Then, by subjecting the substrate 6 shown in FIG. 5 to thermal oxidation for 4 hours in a steam atmosphere at a temperature of 1140° C., a silicon dioxide film 8 of about 1.4 microns in thickness is formed on the channel stopper region 5, as shown in FIG. 6. Since, in this process, the alumina film 7 acts as a barrier against oxygen, the surface of the silicon substrate 6 beneath the alumina film 7 is not or is barely oxidized as a result and, only the surface of the channel stopper region 5 is subjected to thermal oxidation. After the oxidation, of the channel stopper region the surface impurity concentration of the channel stopper region 5 is about $1\times10^{17}$ cm.$^{-3}$ and the depth of that region is about 1 micron. As shown in FIG. 6, about half of the silicon dioxide film 8 is buried in the silicon substrate 6. When it is desired that a greater portion of the oxide film 8 be buried in the substrate, the exposed surface of the future channel stopper region is removed by etching to a controlled depth after the step of FIG. 4, after which the boron diffusion and thermal oxidation are carried out.

Figure 7:
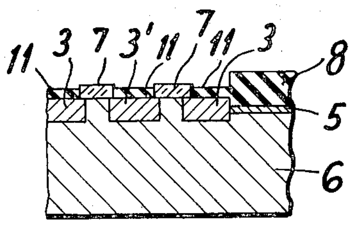
Figure 8:
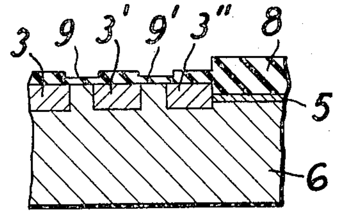
Figure 9:
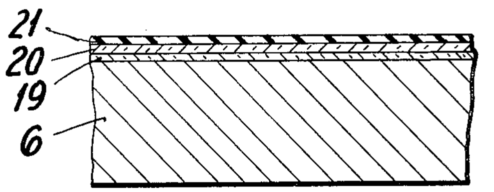

Windows are then opened by photoetching in the alumina film 7 and n-type source and drain regions 3, 3′ and 3″ are formed by the diffusion of phosphorus through the opened windows, as shown in FIG. 7. The source and drain regions 3, 3′, and 3″ have a surface concentration of phosphorus of about $1\times10^{19}$ cm.$^{-3}$ and a diffusion depth of about 1.5 microns and are covered with a silicon oxide film 11 which is formed during the phosphorus diffusion. Additional oxidation may be carried out to further grow the oxide film 11 after the phosphorus diffusion. Thereafter, the remaining alumina film 7 is removed by immersing the entire semiconductor substrate of FIG. 7 into a chromic acid solution. The alumina film 7 only is selectively etched, because the silicon dioxide films 8 and 11 are not attacked by the chromic acid solution. After the alumina film 7 has been etched, a gate insulation film 9 and 9′ is respectively formed as illustrated in FIG. 8 between the remaining portions of the alumina film. In a conventional method, a silicon dioxide film in a portion corresponding to the alumina film 7 is used with the result that the use of a photo-resist is needed for selectively etching the portion in which the gate insulation film is to be formed. In contrast, the use of the photo-resist can be dispensed with by this invention, because a film of a material other than silicon dioxide (e.g. alumina) is employed. To complete the semicondutor integrated circuit structure as shown in FIG. 2, an aperture is provided for the contact to the source and drain regions by a photoetching technique and the gate electrodes 10 and 10′ and the metallic connection 10″ are formed.

Another method according to an alternative embodiment of this invention is illustrated in FIGS. 9–15 which sequentially illustrate the various stages in that method.

As therein shown the surface of a p-type silicon single crystal substrate 6 of a specific resistivity of 4 ohm-cm. is coated with successive layers consisting of a silicon dioxide film 19 of 200 A. in thickness, a silicon nitride film 20 of 2500 A. in thickness, and a silicon dioxide film 21 of 300 A. in thickness. The silicon dioxide film 19 is formed by subjecting the silicon substrate 6 to thermal oxidation for 5 minutes in a steam atmosphere at a temperature of 950° C. Film 19 is coated for the purpose of preventing the surface of the silicon substrate 6 from coming into contact with the hot phosphoric acid when the silicon nitride film 20 is etched in phosphoric acid heated at a temperature of about 170° C., as will be mentioned. The present inventors have found experimentally that once the surface of a silicon substrate comes into contact with hot phosphoric acid, an n-type diffused layer is formed at the surface of the silicon substrate when that substrate is maintained at an elevated temperature, even if cascaded rinsing is performed for several hours for the substrate. In order to prevent the formation of an n-type diffused layer in this manner, the silicon oxide film 19 is interposed between the silicon nitride film 20 and the silicon substrate 6. A suitable thickness for silicon oxide film 19 is between 200 A. and 500 A. The silicon nitride film 20 can be easily formed by a well-known vapor-phase growth technique. For example, a silicon nitride film of 2500 A. in thickness can be deposited by maintaining the silicon substrate 6 coated with the silicon dioxide film 19 for about 10 minutes in a mixed gas atmosphere of ammonium ($NH_3$) and argon (Ar) containing 3% silane ($SiH_4$) at a temperature of 750° C. The silicon nitride film 20 is used as a barrier against oxygen to prevent the underlying material from oxidation and has a suitable thickness of between 1,000 A. and 3,000 A. The silicon dioxide film 21 is formed by a known vapor-phase growth method performed in about 15 minutes in a mixed gas atmosphere consisting of carbon dioxide ($CO_2$) and argon (Ar) containing 3% silane ($SiH_4$) at a temperature of 750° C. Silicon dioxide film 21 is used as a mask for selectively etching the silicon nitride film 20 in hot phosphoric acid.

Figure 10:
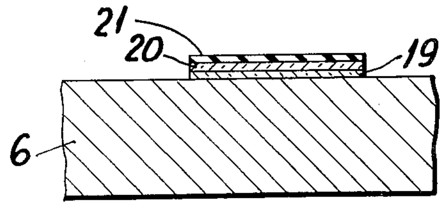

Referring now to FIG. 10, the surface of a portion of the substrate 6 is exposed where a channel stopper region is to be formed. For this purpose, that portion of the silicon dioxide film 21 under which the channel stopper region is to be formed is selectively removed by a photoetching technique. Using the remaining silicon dioxide film 21 as a mask, the silicon nitride film 20 is selectively etched in phosphoric acid heated at a temperature of 170° C. In about 20 minutes, the selective etching of the silicon nitride film 20 is accomplished. The silicon dioxide film 19 prevents phosphoric acid from being brought into contact with the surface of the silicon substrate 6 and accordingly, the adverse effect of phosphoric acid on the silicon substrate as mentioned previously can be prevented. The etching rate of silicon dioxide formed by thermal oxidation with respect to hot phosphoric acid is less than one-tenth (1/10) of that of silicon nitride. Therefore, the silicon dioxide film 21 can work as a mask, provided that its thickness is more than one-tenth of that of the nitride film 20. The exposed portion of the silicon dioxide film 19 is then etched by buffered fluoric acid.

Figure 11:
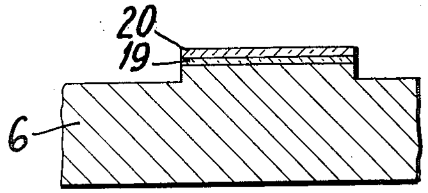

Referring to FIG. 11, the exposed surface portion of the silicon substrate 6 is then shallowly removed to the depth of about 0.6 micron. The purpose of this shallow removal is to bury the greater part of a thick silicon dioxide film, which is to be subsequently on the channel stopper region, in the silicon substrate and thereby make the surface of the thick silicon dioxide film substantially flush with the surface of a silicon dioxide film to be formed on the active region of the substrate. The shallow removal of the substrate is carried out by thermally oxidizing the exposed surface of the silicon substrate 6 in a steam atmosphere for 4 hours at a temperature of 1140° C. to grow a silicon oxide film on the exposed surface of the substrate and thereafter etching the grown silicon oxide film by buffered fluoric acid. In this case, the silicon nitride film 20 acts as a barrier mask against oxygen during the thermal oxidation and as a mask during the etching in buffered fluoric acid.

Figure 13:
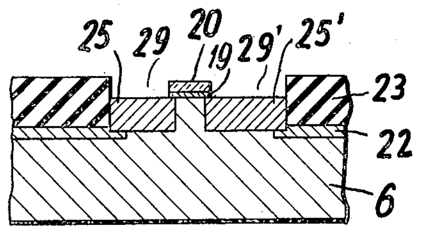
Figure 14:
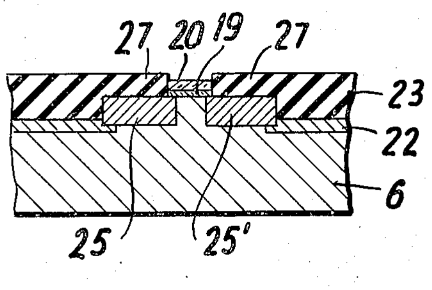
Figure 12:
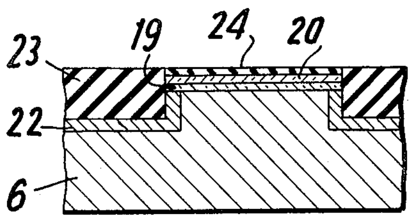

Thereafter, as shown in FIG. 12 a p±type channel stopper region 22 is formed by a vapor phase diffusion operation in the same manner as in the first described embodiment. Thereafter, a thick silicon dioxide film 23 of 1.5 microns in thickness is formed by thermal oxidation in a steam atmosphere for 4 hours at a temperature of 1140° C., as shown in FIG. 12. In this thermal oxidation process, the surface of the silicon nitride film 20 is converted into a silicon dioxide film 24 by a depth of about 1,000 A. The silicon nitride film 20 and the silicon dioxide film 19 on the portion of the substrate 6 in which source and drain regions of a transistor are to be formed are then selectively etched in the same manner as in the process through which the structure shown in FIG. 10 is reached, to provide windows 29 and 29' as shown in FIG. 13. In this etching process, the silicon dioxide film 24 can be used as a masking layer corresponding to the previously mentioned silicon dioxide film 21. Through the thus formed windows 29, and 29', phosphorus is diffused into the substrate 6 to form an n-type source region 25 and an n-type drain region 25', as shown in FIG. 13. The substrate 6 is further oxidized in a steam atmosphere for 30 minutes at a temperature of 1070° C. to form a silicon dioxide film 27 of about 0.5 micron in thickness, as shown in FIG. 14. Since the greater part of the thickness of the thick silicon dioxide film 23 on the channel stopper region 22 is imbedded in the silicon substrate 6, the surfaces of the silicon dioxide layers 23 and 27 are substantially flush that is, at the same level.

Figure 15:
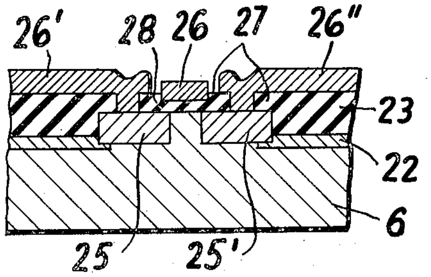

Without providing a mask, the silicon nitride film 20 and the silicon dioxide film 19 are then respectively etched by hot phosphoric acid and by buffered fluoric acid to expose thesurface of the substrate. On this exposed surface, a gate oxide film 28 is newly formed. This is followed by the formation of contact holes for the source and drain electrodes in the oxide film 27 using a photoetching technoque, and the provision of the gate electrode 26 and metallic layers 26' and 26'' as source and drain electrodes and also as interconnecting means, as shown in FIG. 15.

Since the surfaces of the silicon dioxide films 23 and 27 are substantially at the same level, the possibility of the occurrence of an open-circuit of the metallic layers 26 and 26'' overlying the surfaces that would otherwise occur can be eliminated.

While the invention has been herein specifically described with respect to two embodiments thereof, it will be understood that modifications may be made therein, all without departing from the spirit and scope of the invention.

What is claimed is:

1. A method of manufacturing an insulated gate filed effect semiconductor device having a channel stopper region comprising the steps of (a) coating the surface of a semiconductor substrate made of silicon of one conductivity type with a first insulating film of a material that acts as a barrier to thermal oxidation of the surface semiconductor substrate, (b) forming a channel stopper opening by selectively photoetching said first insulating film, (c) diffusing an impurity of said one conductivity type through said channel stopper opening into said semiconductor substrate to form a channel stopper region with said one conductivity type, (d) forming a silicon dioxide film on said channel stopper region by thermal oxidation while employing said first insulation film as a barrier to the thermal oxidation of the surface coated with said first insulating film, (e) forming source and drain openings by selectively photo-etching said first insulating film, (f) diffusing an impurity of the opposite conductivity type through said source and drain openings into said semiconductor substrate to form source and drain regions of the opposite conductivity type, (g) etching said first insulating film now covering only a channel region of an intended insulated-gate field effect transistor, and (h) forming a gate insulating film on said channel region.

2. The method of Claim 1, in which said first insulating film is formed of a material selected from the group consisting of alumina and silicon nitride.

3. The method of Claim 1, in which said first insulating film is an alumina film having a thickness of 2,000 to 10,000 angstroms.

4. The method of Claim 1, in which said first insulating film is a silicon nitride film having a thickness of 1,000 to 3,000 angstroms.

5. The method of Claim 1, in which said first insulating film consists of a silicon nitride film having a thickness of between 1,000 to 3,000 angstroms and a silicon dioxide film lying between said silicon nitride film and the surface of said substrate and having a thickness of between 200 to 500 angstroms.

6. The method of Claim 1, further comprising the step of shallowly etching the surface of said substrate not covered with said first insulating film before said step of forming said silicon dioxide film.

References Cited

UNITED STATES PATENTS

| | | | |
|---|---|---|---|
| 3,646,665 | 3/1972 | Kim | 29—578 X |
| 3,670,403 | 6/1972 | Lawrence | 156—17 X |
| 3,652,324 | 3/1972 | Ting L. Chu et al. | 156—17 X |

WILLIAM A. POWELL, Primary Examiner

U.S. Cl. X.R.

29—571; 117—212; 156—17; 317—235